United States Patent
Ngo et al.

(10) Patent No.: US 6,809,043 B1
(45) Date of Patent: Oct. 26, 2004

(54) MULTI-STAGE, LOW DEPOSITION RATE PECVD OXIDE

(75) Inventors: Minh Van Ngo, Fremont, CA (US); Robert A. Huertas, Hollister, CA (US); Hieu Pham, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 16 days.

(21) Appl. No.: 10/173,611

(22) Filed: Jun. 19, 2002

(51) Int. Cl.⁷ .................. H01L 21/31; H01L 21/469
(52) U.S. Cl. ................................. 438/788; 438/787
(58) Field of Search ........................... 438/788, 787

(56) References Cited

U.S. PATENT DOCUMENTS

| | | | |
|---|---|---|---|
| 5,736,423 A | * | 4/1998 | Ngo ................ 437/238 |
| 5,986,329 A | * | 11/1999 | Ngo ................ 257/635 |
| 6,077,764 A | * | 6/2000 | Sugiarto et al. ...... 438/597 |
| 6,221,793 B1 | | 4/2001 | Ngo et al. |
| 6,235,654 B1 | | 5/2001 | Ngo et al. |
| 6,242,367 B1 | | 6/2001 | Sun et al. |

* cited by examiner

Primary Examiner—Alexander Ghyka

(57) ABSTRACT

A silicon oxide layer is deposited at a thickness of about 50 Å or less by a multi-stage method comprising depositing a sub-layer of silicon oxide in each stage by PECVD at a low deposition rate. Embodiments include depositing a silicon dioxide liner over a gate electrode in at least four stages, each stage comprising depositing a sub-layer at a thickness of 10 Å or less.

17 Claims, 3 Drawing Sheets

MULTI-STAGE, LOW DEPOSITION RATE PECVD OXIDE

FIELD OF THE INVENTION

The present invention relates to a method of fabricating semiconductor device s exhibiting high reliability and superior repeatability. The present invention has particular applicability in fabricating high density, multi-level semiconductor devices with feature dimensions in the deep sub-micron regimne.

BACKGROUND OF THE INVENTION

As the drive for the continued miniaturization proceeds apace, various issues arise imposing increasing demands for methodology enabling the fabrication of semiconductor devices having high reliability and high circuit speed. As the gate width for transistors decreases to about 0.13 micron and under, and as a gate dielectric layers are reduced to about 11 Å to 13 Å, various issues arise in front end of line (FEOL) microprocessor device fabrication, particularly when employing a silicon-on-insulator (SOI) substrate on which transistors are formed.

A particular problem stems from the undesirable generation of an overlap capacitance under the gate electrode. Such an overlap capacitance is believed generated by the high temperatures employed to deposit a silicon oxide, e.g., a silicon dioxide layer, by conventional techniques, such as thermal oxidation or low pressure chemical vapor deposition, such as elevated temperatures of 800° C. to 1000° C. The use of such high deposition temperatures undesirably results in silicon consumption and diffusion of the shallow source drain extensions under the gate electrode to an undesirable degree. Silicon oxide layers are typically deposited at a thickness of about 90 Å to about 110 Å, e.g., about 100 Å.

Accordingly, there exists a need for methodology enabling the fabrication of highly reliable semiconductor devices with high circuit speed, particularly semiconductor devices with transistors formed on SOI substrates. There exists a particular need for methodology enabling the deposition of an ultra thin silicon oxide layer over a gate electrode to form silicon oxide sidewall spacers at a reduced thickness, such as at about 50 Å or less, with superior within wafer uniformity, excellent step coverage and excellent repeatability from wafer to wafer.

SUMMARY OF THE INVENTION

An advantage of the present invention is a method of manufacturing a semiconductor device having improved reliability.

Another advantage of the present invention is a method of manufacturing a semiconductor device comprising transistors with reduced overlap capacitance, particularly transistors formed on SOI substrates.

A further advantage of the present invention is a method of manufacturing a semiconductor device comprising depositing a silicon dioxide layer over a gate electrode with improved within water uniformity, improved wafer-to-wafer uniformity, high step coverage and reduced pinholes.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method manufacturing a semiconductor device, the method comprising depositing a layer of silicon oxide at a total thickness of 50 Å or less in a plurality of deposition stages, each stage comprising depositing a sub-layer of silicon oxide by plasma enhanced chemical vapor deposition (PECVD).

Embodiments of the present invention comprise depositing a layer of silicon dioxide in at least four stages, e.g., five stages, each stage conducted at a reduced deposition rate of about 540 Å/minute or less at a temperature of about 400° C. to about 450° C. Embodiments of the present invention further include depositing a layer of silicon oxide at a total thickness of about 50 Å or less, e.g., about 40 Å or less, in a plurality of deposition stages, each deposition stage comprising depositing a sub-layer of silicon dioxide at a thickness of about 6 Å to about 10 Å.

Further embodiments of the present invention comprise forming a gate electrode over a substrate, such as an SOI substrate, with a gate dielectric layer therebetween, ion implanting impurities to form shallow source/drain extensions, depositing a layer of silicon dioxide in a plurality of stages at a temperature of about 400° C. to about 450° C., etching to form silicon dioxide sidewall spacers on side surfaces of the gate electrode, the silicon dioxide sidewall spacers having a thickness no greater than 50 Å, depositing a layer of silicon nitride in the same deposition apparatus employed for depositing the silicon dioxide layer, etching to form silicon nitride layers on the silicon dioxide sidewall spacers, ion implanting impurities to form moderately or heavily doped source/drain regions, and subsequently annealing to activate the shallow source/drain extensions and source/drain regions.

Additional advantages of the present invention will become readily apparent to those skilled in this art from the following detailed description wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 6, similar features or elements are denoted by similar reference characters.

DETAILED DESCRIPTION OF THE INVENTION

Figure 1:
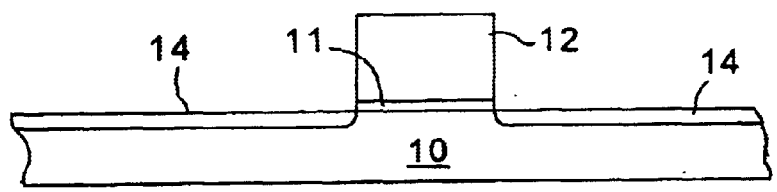
FIGS. 1 through 4 schematically illustrate sequential phases of a method in accordance with an embodiment of the present invention.

As semiconductor device feature sizes continued to shrink into the deep-submicron regime, various issues arise during FEOL fabrication techniques, such as an undesirable overlap capacitance of transistors, particularly transistors formed on SOI substrates. Upon conducting experiments and investigations, it was hypothesized that such an overlap capacitance stems from the undesirably high temperatures, e.g., 800° C. to 1,000° C., employed during conventional deposition techniques used to form silicon oxide sidewall spacers, typically at a thickness of about 100 Å. At such high deposition temperatures, silicon from the substrate is undesirably consumed and impurities in the shallow source/drain extension implants are diffused under the gate electrode to an undesirable extent. The present invention addresses and solves that problem by strategically forming an ultra-thin silicon oxide sidewall spacer on side surfaces of the gate electrodes, particularly gate electrodes of transistors formed on SOI substrates, as at a thickness of about 50 Å or less, e.g., about 40 Å or less. In embodiments of the present invention, that objective is achieved by depositing a silicon oxide layer, e.g., a silicon dioxide layer, in a plurality of stages, each stage comprising depositing a sub-layer of silicon dioxide by PECVD at a reduced deposition rate of about 540 Å/minute of less, In accordance with embodiments with the present invention, each deposition stage is conducted at a significantly reduced temperature, such as a temperature of about 370° C. to about 430° C., thereby minimizing silicon consumption and significantly reducing dopant diffusion. In accordance with embodiments of the present invention, the silicon dioxide layer is deposited in a plurality of stages, such as at least four deposition stages, e.g., five deposition stages, each deposition stage resulting in the deposition of a sub-layer of silicon dioxide having a thickness of 10 Å or less, e.g., 6 Å to 10 Å. Such multi-stage deposition significantly improves within water uniformity, step coverage, wafer-to-wafer uniformity and pinhole elimination.

In embodiments of the present invention, the flow rate of certain components is reduced, such as the silane ($SiH^4$) flow rate, and the pressure is reduced. The inventive methodology enables the deposition of silicon dioxide layers having significantly reduced pinholes, significantly improved within wafer and wafer-to-wafer uniformity and excellent step coverage. For example, testing was conducted comprising depositing an ultra thin layer of silicon dioxide at a thickness of about 40 Å in a plurality of deposition stages, such as five deposition stages, at a reduced temperature, reduced silane flow rate and reduced pressure, to achieve a within wafer uniformity of less than 1.5%, and a step coverage of greater than 85%, the step coverage being measured by the thickness of the silicon dioxide layer deposited on the side surface of the gate electrode with respect to the thickness of the silicon layer deposited on the upper surface of the gate electrode. In particular testing involving deposition of a silicon dioxide layer at a total thickness of about 40 Å in a plurality of stages, the repeatability or among 25 wafers or wafer-to-wafer uniformity, ranged from 39.8 Å to 40.84 Å.

Embodiments of the present invention include initially heat soaking the wafer for at least 60 seconds before initiating deposition. Embodiments of the present invention also include employing a sub-100 sccm analog-type controller for regulating $SiH_4$ flow during sub-layer depositions for better process control.

The particular mechanism underpinning the advantages achieved by the present invention is not known with certainty. However, it is believed that by depositing the silicon dioxide layer at a reduced flow rate, a reduced pressure, the mean free path is increased, thereby providing superior quality layers having reduced pinholes, higher density, higher thickness uniformity and excellent; step coverage. In addition, the reduced deposition temperature minimizes silicon consumption and reduces dopant diffusion.

An embodiment of the present invention is schematically illustrated in FIGS. 1 through 4, wherein similar features are denoted by similar reference characters. Adverting to FIG. 1, a gate electrode 12 is formed over a substrate 10, with a gate dielectric layer 11 therebetween. Embodiments of the present invention comprise utilizing a SOI substrate as substrate 10. Ion implantation is conducted to form shallow source/drain extensions 14, using the gate electrode 12 as a mask.

Figure 2A:
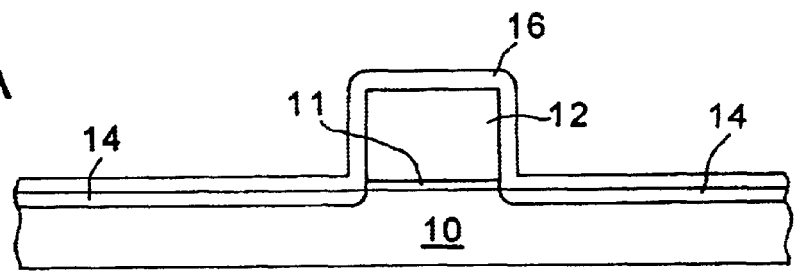

As illustrated in FIG. 2A, a layer of silicon dioxide 16 is deposited, in accordance with the methodology of the present invention, in a plurality of deposition stages. Adverting to FIG. 2B, which is a schematic exaggeration of FIG. 2A, the silicon dioxide layer 16 is depicted in a plurality of five sub-layers 16A, 16B, 16C, 16D and 16E. Silicon dioxide layer 16 can be deposited at a thickness of 40 Å, each sub-layer deposited by PECVD at a reduced temperature of 370° C. to 430° C. and at a reduced deposition rate of about 540 Å/minute or less. Each deposition stage is conducted at a reduced $SiH_4$ flow rate, reduced pressure and reduced temperature. For example, embodiments of the present invention comprise depositing each sub-layer at a $SiH_4$ flow rate of 20 to 60 sccm; an $N_2$ flow rate of 2000 to 3000 sccm; a $N_2O$ flow rate of 7000 to 9000 sccm; an RF power of 150 to 400 watts; a pressure of 0.5 to 1.1 Torr, e.g., 0.9 Torr, a temperature of about 370° C. to about 430° C. Each of such deposition stages can be conducted for about 0.8 to about 2 seconds, yielding sub-layers, each sub-layer having a thickness of about 6 Å to about 10 Å.

Figure 3:
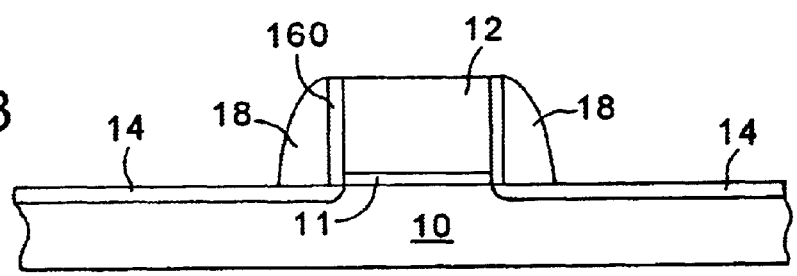
Figure 4:
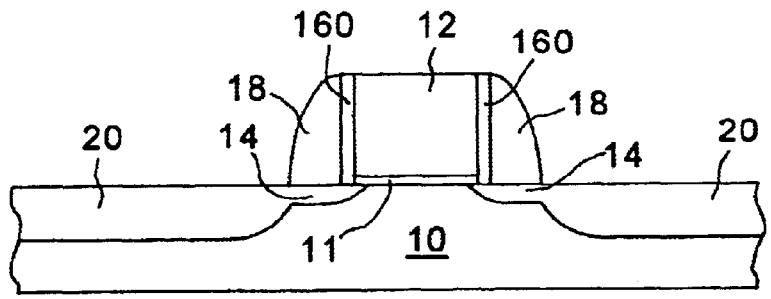

Subsequently, anisotropic etching is conducted to form silicon dioxide liner 160 on side surfaces of gate electrode 12, a layer of silicon nitride deposited and anisotropically etched to form silicon nitride sidewall spacers 18 on silicon dioxide liner 160 on side surfaces of gate electrode 12, as illustrated in FIG. 3. Ion implantation is then conducted followed by activation annealing resulting in the structure illustrated in FIG. 4 comprising source/drain regions 20.

Figure 6:
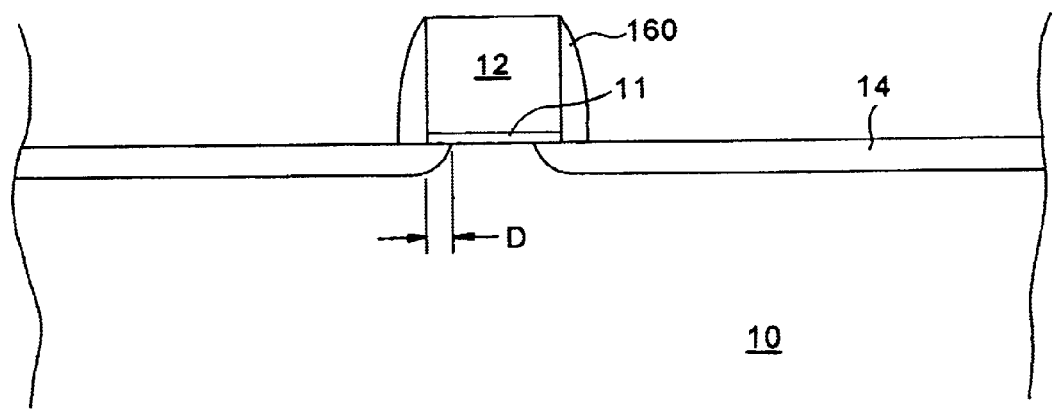
FIG. 6 schematically illustrates improved overlap capacitance achieved by embodiments of the present invention.

Adverting to FIG. 6, the overlap capacitance region D is desirably reduced in accordance with embodiments of the present invention vis-a-vis conventional practices by forming the silicon dioxide liner 160 at a significantly reduced thickness, e.g., about 40 Å or less, by the inventive methodology achieving with higher reliability, improved step coverage and improved uniformity both within wafer and wafer-to-wafer. In addition, silicon dioxide liner 160 exhibits reduced pinholes and high density, thereby improving device reliability.

In accordance with embodiments of the present invention, both silicon dioxide layer and silicon nitride layer can, be deposited in the same deposition chamber. During deposition of the silicon nitride layer, reactants employed are $SiH_4$, $N_2$ and ammonia ($NH_3$). Advantageously, the silicon nitride layer can also be deposited in a plurality of stages, thereby further improving the characteristics of the silicon nitride sidewall spacer.

Figure 5A:
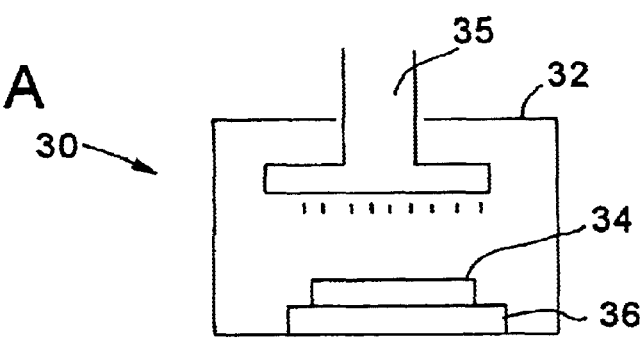
FIGS. 5A and 5B schematically illustrate an apparatus for use in practicing embodiments of the present invention.
Figure 2B:
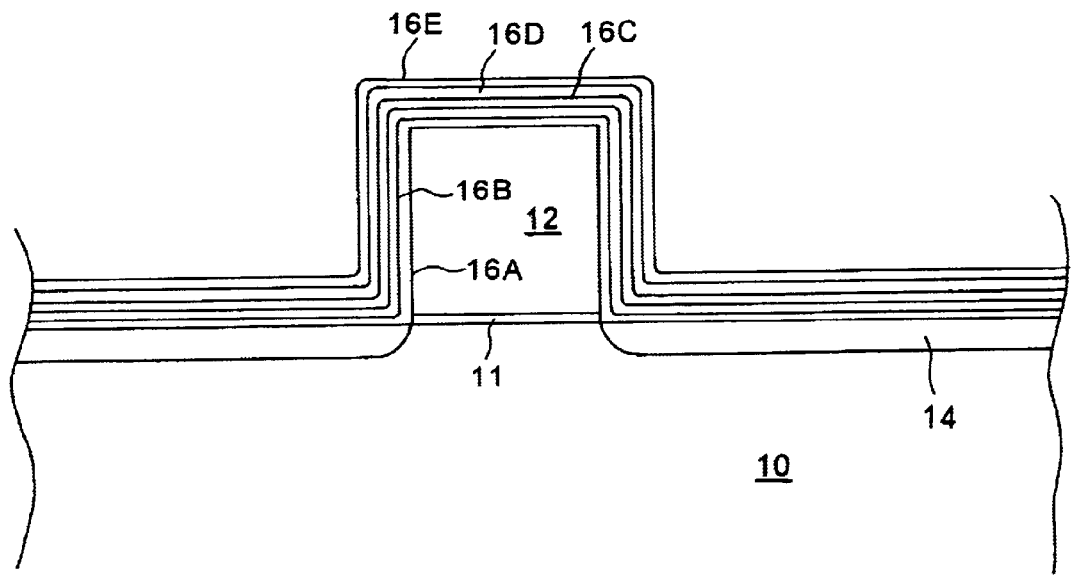
Figure 5B:
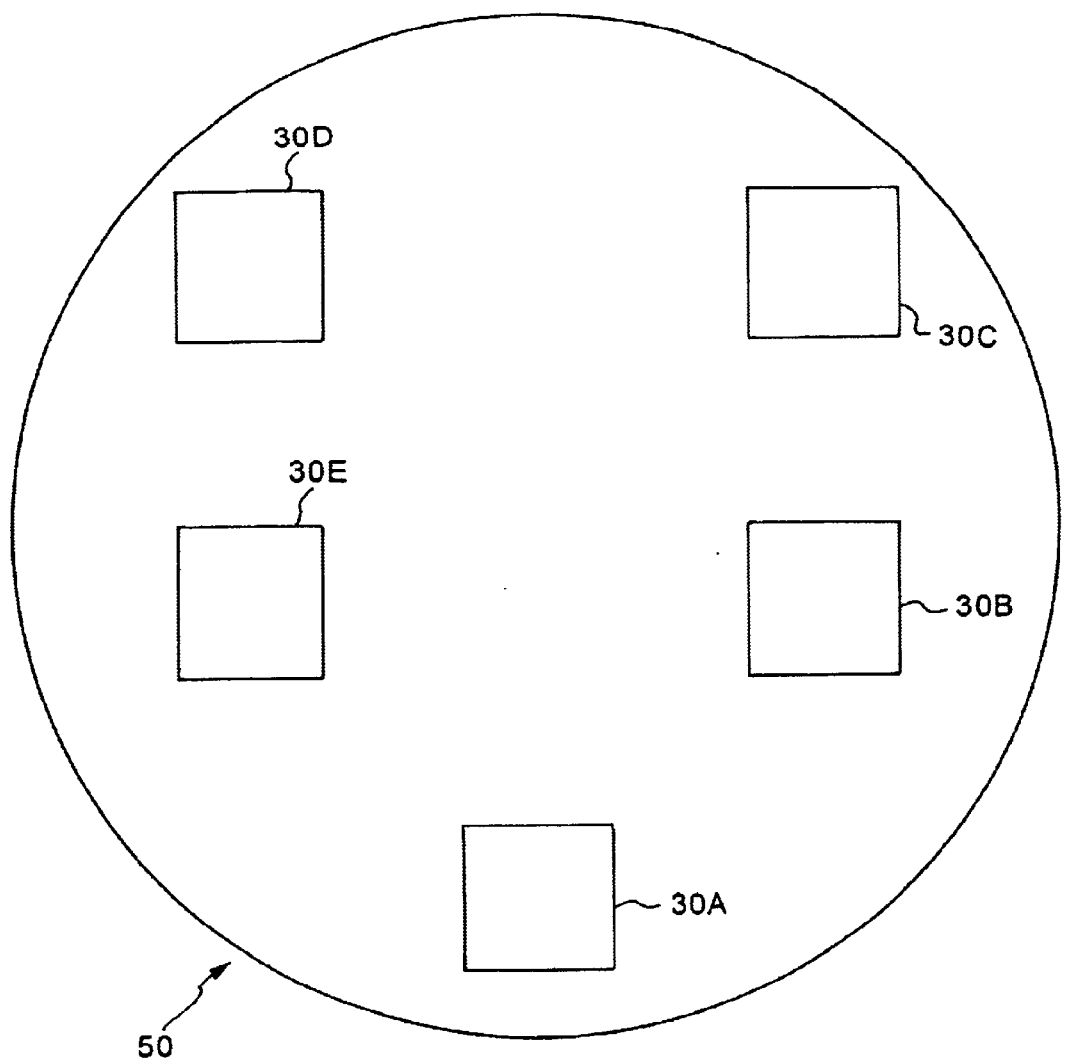

FIG. 5A schematically illustrates a single deposition stage 32 comprising a wafer susceptor 36 on which a wafer 34 is placed under shower head 35. FIG. 5B illustrates an arrangement of deposition stages 30A, 30B, 30C, 30D and 30E arranged in a single deposition apparatus 50 for use in embodiments of the present invention wherein the wafer is transporter between from one deposition stage to the other by wafer handling means (not shown).

The present invention advantageously enables fabricating semiconductor devices, particularly semiconductor devices comprising transistors formed on SOI substrates, with reduced overlap capacitance. The present invention advantageously provides methodology enabling the deposition of a silicon dioxide liner on gate electrodes in a plurality of deposition stages under conditions which result in improved step coverage, improved within wafer and wafer-to-wafer uniformity, high quality liners with reduced pinholes and higher density.

The present invention enjoys industrial applicability in fabricating various type of semiconductor devices. The present invention enjoys particular industrial applicability in fabricating highly integrated semiconductor devices exhibiting increased circuit speed and submicron dimensions, e.g., with a design rule of about 0.12 micron and under, with high reliability.

The present invention enjoys industrial applicability in fabricating various types of semiconductor devices. The present invention enjoys particular industrial applicability in fabricating highly integrated semiconductor devices exhibiting increased circuit speed and submicron dimensions, e.g., with a design rule of about 0.12 micron and under, with high reliability.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and environments and is capable of changes and modifications within the scope of the inventive concept as expressed herein.

What is claimed is:

1. A method of manufacturing a semiconductor device, the method comprising depositing a layer of silicon oxide at a total thickness of 50 Å or less in a plurality of deposition stages, each stage comprising depositing a sub-layer of silicon oxide by plasma enhanced chemical vapor deposition (PECVD) at a deposition rate of 540 Å/minute or less.

2. The method according to claim 1, comprising depositing each sub-layer at a different deposition station within a multi-stage deposition apparatus.

3. The method according to claim 1, comprising depositing each sub-layer at a thickness of 10 Å or less.

4. The method according to claim 3, comprising depositing the layer of silicon oxide in at least four deposition stages.

5. The method according to claim 4, comprising depositing the silicon oxide layer in five deposition stages.

6. The method according to claim 1, comprising depositing each sub-layer of silicon oxide at:
   a silane ($SiH_4$) flow rate of 10 to 60 sccm;
   a nitrogen ($N_2$) flow rate of 2000 to 3000 sccm;
   a nitrous oxide ($N_2O$) flow rate of 7000 to 9000 sccm;
   an RF power of 100 to 300 watts;
   a pressure of 0.5 to 1.0 Torr; and
   a temperature of 350° C. to 450° C.,
   for 2 seconds or less.

7. The method according to claim 6, comprising depositing each sub-layer at a thickness of 10 Å or less.

8. The method according to claim 7, comprising depositing the layer of silicon oxide in at least four stages.

9. The method according to claim 8, comprising depositing a layer of silicon oxide in five stages.

10. The method according to claim 1, comprising depositing the silicon oxide layer at a total thickness of 40 Å or less.

11. The method according to claim 10, comprising depositing each sub-layer at a thickness of 10 Å or less.

12. The method according to claim 11, comprising depositing the silicon oxide layer in at least four deposition states.

13. The method according to claim 12, comprising depositing the silicon oxide layer in five deposition stages.

14. The method according to claim 1, comprising depositing the silicon oxide layer over a gate electrode formed on a substrate with a gate dielectric layer therebetween.

15. The method according to claim 14, comprising:
   etching the layer of silicon oxide to form silicon oxide sidewall spacers on side surfaces of the gate electrode;
   depositing a layer of silicon nitride; and
   etching to form a layer of silicon nitride on the silicon oxide sidewall spacers.

16. The method according to claim 15, comprising depositing the layer of silicon oxide and the silicon nitride layer in the same deposition chamber and depositing the silicon nitride layer in a plurality of stages.

17. The method according to claim 14, wherein the substrate comprises a silicon-on-insulator (SOI) substrate.

* * * * *